(12) United States Patent
Urzhumov et al.

(10) Patent No.: US 10,833,381 B2
(45) Date of Patent: Nov. 10, 2020

(54) METAMATERIAL PHASE SHIFTERS

(71) Applicant: Searete LLC, Bellevue, WA (US)

(72) Inventors: Yaroslav A. Urzhumov, Bellevue, WA (US); Matthew S. Reynolds, Seattle, WA (US); Guy S. Lipworth, Seattle, WA (US); Russell J. Hannigan, Sammamish, WA (US); Daniel Arnitz, Seattle, WA (US); Joseph Hagerty, Seattle, WA (US)

(73) Assignee: The Invention Science Fund I LLC, Bellevue, WA (US)

( * ) Notice: Subject to any disclaimer, the term of this patent is extended or adjusted under 35 U.S.C. 154(b) by 470 days.

(21) Appl. No.: 15/807,338

(22) Filed: Nov. 8, 2017

(65) Prior Publication Data

US 2019/0140350 A1    May 9, 2019

(51) Int. Cl.

| | |
|---|---|
| *H01P 1/18* | (2006.01) |
| *H01Q 15/00* | (2006.01) |
| *H01Q 3/40* | (2006.01) |
| *H03H 11/20* | (2006.01) |
| *H03H 9/66* | (2006.01) |

(Continued)

(52) U.S. Cl.
CPC .................. *H01P 1/18* (2013.01); *H01Q 3/26* (2013.01); *H01Q 3/40* (2013.01); *H01Q 15/0086* (2013.01); *H03H 7/20* (2013.01); *H03H 9/66* (2013.01); *H03H 11/20* (2013.01); *H04B 1/00* (2013.01)

(58) Field of Classification Search
CPC ........ H01P 1/18; H01Q 3/26; H01Q 15/0086; H01Q 3/40; H04B 1/00; H03H 11/20; H03H 9/66; H03H 7/20

USPC ....... 333/125, 126, 128, 134, 135, 136, 137, 333/156–161
See application file for complete search history.

(56) References Cited

U.S. PATENT DOCUMENTS

| | | | |
|---|---|---|---|
| 4,947,176 A | 8/1990 | Inatsune et al. | |
| 5,005,418 A | 4/1991 | Anderson | |

(Continued)

FOREIGN PATENT DOCUMENTS

WO    WO 2014/018052 A1    1/2014

OTHER PUBLICATIONS

European Patent Office, Extended European Search Report, Pursuant to Rule 62 EPC; App. No. EP 16812357; dated Dec. 3, 2018; pp. 1-7.

(Continued)

*Primary Examiner* — Robert J Pascal
*Assistant Examiner* — Jorge L Salazar, Jr.

(57) ABSTRACT

The present technology pertains to a system and method of operation of a metamaterial phase shifter having various use applications. In one aspect of the present disclosure, a phase shifter includes a network of tunable impedance elements and a controller. The controller is coupled to the network of tunable impedance elements and configured to receive a phase shift input value and determine a corresponding tuning voltage to be supplied to each tunable impedance element of the network of tunable impedance elements based on the phase shift input value, the network of tunable impedance element being configured to shift a phase of an input signal based on tuning voltages supplied to the network of tunable impedance elements by the controller.

43 Claims, 5 Drawing Sheets

(51) Int. Cl.
*H03H 7/20* (2006.01)
*H01Q 3/26* (2006.01)
*H04B 1/00* (2006.01)

(56) References Cited

U.S. PATENT DOCUMENTS

| | | |
|---|---|---|
| 5,208,653 A | 5/1993 | Mark et al. |
| 5,411,532 A | 8/1995 | Fenn |
| 5,920,285 A | 7/1999 | Benjamin |
| 5,930,314 A | 7/1999 | Lanza |
| 6,533,733 B1 | 3/2003 | Ericson et al. |
| 6,876,337 B2 | 4/2005 | Larry |
| 6,879,693 B2 | 4/2005 | Miller et al. |
| 7,162,250 B2 | 1/2007 | Misra |
| 7,924,226 B2 | 4/2011 | Soler Castany et al. |
| 7,928,900 B2 | 4/2011 | Fuller et al. |
| 8,504,138 B1 | 8/2013 | Pivonka et al. |
| 8,847,840 B1 | 9/2014 | Diaz |
| 9,252,492 B2 | 2/2016 | Alrabadi et al. |
| 9,917,376 B2 | 3/2018 | Belmkaddem et al. |
| 2002/0130804 A1 | 9/2002 | McMakin et al. |
| 2002/0158798 A1 | 10/2002 | Chiang et al. |
| 2003/0011515 A1 | 1/2003 | Warble et al. |
| 2003/0123565 A1 | 7/2003 | Fukuda et al. |
| 2004/0162034 A1 | 8/2004 | Parker |
| 2004/0201526 A1 | 10/2004 | Knowles et al. |
| 2004/0242272 A1 | 12/2004 | Aiken et al. |
| 2007/0191064 A1 | 8/2007 | Skarby et al. |
| 2007/0288066 A1 | 12/2007 | Christman et al. |
| 2008/0015421 A1 | 1/2008 | Penner |
| 2008/0048917 A1 | 2/2008 | Achour et al. |
| 2008/0052505 A1 | 2/2008 | Theobald |
| 2008/0054899 A1 | 3/2008 | Aksoy et al. |
| 2008/0204347 A1 | 8/2008 | Alvey et al. |
| 2008/0292011 A1 | 11/2008 | Yang |
| 2009/0284431 A1 | 11/2009 | Meharry et al. |
| 2010/0022861 A1 | 1/2010 | Cinbis et al. |
| 2010/0136926 A1 | 6/2010 | Lackey |
| 2010/0262160 A1 | 10/2010 | Boyden et al. |
| 2010/0262239 A1 | 10/2010 | Boyden et al. |
| 2010/0301971 A1 | 12/2010 | Yonak et al. |
| 2010/0324378 A1 | 12/2010 | Tran et al. |
| 2011/0003608 A1 | 1/2011 | Forenza et al. |
| 2011/0065448 A1 | 3/2011 | Song et al. |
| 2011/0086598 A1 | 4/2011 | Ali et al. |
| 2011/0087306 A1 | 4/2011 | Goossen |
| 2011/0260920 A1 | 10/2011 | Dybdal et al. |
| 2012/0212328 A1 | 8/2012 | Blair et al. |
| 2013/0154558 A1 | 6/2013 | Lee et al. |
| 2013/0208332 A1 | 8/2013 | Yu et al. |
| 2013/0266319 A1 | 10/2013 | Bodan et al. |
| 2013/0324076 A1 | 12/2013 | Harrang |
| 2013/0335256 A1 | 12/2013 | Smith et al. |
| 2014/0039277 A1 | 2/2014 | Abraham |
| 2014/0056378 A1 | 2/2014 | Harel et al. |
| 2014/0128032 A1 | 5/2014 | Muthukumar |
| 2014/0211298 A1 | 7/2014 | Sayyah et al. |
| 2014/0231627 A1 | 8/2014 | Wakatsuki et al. |
| 2014/0266946 A1 | 9/2014 | Bily et al. |
| 2014/0268436 A1 | 9/2014 | Du et al. |
| 2014/0306784 A1 | 10/2014 | Broyde et al. |
| 2014/0334565 A1 | 11/2014 | Tzanidis et al. |
| 2014/0340732 A1 | 11/2014 | Zhang et al. |
| 2015/0109181 A1 | 4/2015 | Hyde et al. |
| 2015/0130285 A1 | 5/2015 | Leabman et al. |
| 2015/0162658 A1 | 6/2015 | Bowers et al. |
| 2015/0171516 A1 | 6/2015 | Chen et al. |
| 2015/0189568 A1 | 7/2015 | Stanze et al. |
| 2016/0013531 A1* | 1/2016 | Casse ................. H01Q 3/36 333/161 |
| 2016/0044296 A1 | 2/2016 | Sun et al. |
| 2016/0074196 A1 | 3/2016 | Forsell |
| 2016/0149312 A1 | 5/2016 | Henry et al. |
| 2016/0190698 A1 | 6/2016 | Andresen et al. |
| 2016/0239060 A1 | 8/2016 | Koob et al. |
| 2016/0344240 A1 | 11/2016 | Yeh et al. |
| 2017/0063344 A1 | 3/2017 | Broyde et al. |
| 2017/0063439 A1 | 3/2017 | Frank |
| 2017/0163327 A1 | 6/2017 | Yang et al. |
| 2017/0229774 A1 | 8/2017 | Schuehler et al. |
| 2017/0250746 A1 | 8/2017 | Wang et al. |
| 2017/0351102 A1 | 12/2017 | Wertsberger |
| 2017/0356980 A1 | 12/2017 | Islam et al. |

OTHER PUBLICATIONS

PCT International Search Report; International App. No. PCT/US2018/053759; dated Jan. 31, 2019; pp. 1-3.

* cited by examiner

METAMATERIAL PHASE SHIFTERS

If an Application Data Sheet (ADS) has been filed on the filing date of this application, it is incorporated by reference herein. Any applications claimed on the ADS for priority under 35 U.S.C. §§ 119, 120, 121, or 365(c), and any and all parent, grandparent, great-grandparent, etc., applications of such applications are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC § 119(e) for provisional patent applications, for any and all parent, grandparent, great-grandparent, etc. applications of the Priority Application(s)).

PRIORITY APPLICATIONS

None.

RELATED APPLICATIONS

This application is related to U.S. patent application Ser. No. 15/183,291, filed on Jun. 15, 2016, entitled METHODS AND SYSTEMS FOR COMMUNICATION WITH BEAMFORMING ANTENNAS, and published as U.S. Pat. Pub. No. 2006/0373181; U.S. patent application Ser. No. 15/253,606, filed on Aug. 31, 2016, entitled TUNABLE MEDIUM LINEAR CODER; U.S. patent application Ser. No. 15/409,401, filed on Jan. 18, 2017, entitled TUNABLE MEDIUM LINEAR CODER; U.S. patent application Ser. No. 15/586,157, filed on May 3, 2017, entitled DYNAMIC METAMATERIAL CODED-APERTURE IMAGING; U.S. patent application Ser. No. 15/048,878 filed on Feb. 19, 2016, entitled TRANSMITTER CONFIGURED TO PROVIDE A CHANNEL CAPACITY THAT EXCEEDS A SATURATION CHANNEL CAPACITY, and published as U.S. Pat. Pub. No. 2017/0244454; U.S. patent application Ser. No. 15/048,880 filed on Feb. 19, 2016, entitled RECEIVER CONFIGURED TO PROVIDE A CHANNEL CAPACITY THAT EXCEEDS A SATURATION CHANNEL CAPACITY, and published as U.S. Pat. Pub. No. 2017/0244453; U.S. patent application Ser. No. 15/048,884 filed on Feb. 19, 2016, entitled SYSTEM WITH TRANSMITTER AND RECEIVER REMOTE PROM ONE ANOTHER AND CONFIGURED TO PROVIDE A CHANNEL CAPACITY THAT EXCEEDS A SATURATION CHANNEL CAPACITY, and published as U.S. Pat. Pub. No. 2017/0244450; U.S. patent application Ser. No. 15/048,888 filed on Feb. 19, 2016, entitled SYSTEM WITH TRANSMITTER AND RECEIVER CONFIGURED TO PROVIDE A CHANNEL CAPACITY THAT EXCEEDS A SATURATION CHANNEL CAPACITY, and published as U.S. Pat. Pub. No. 2017/0244455; U.S. patent application Ser. No. 14/918,331, filed on Oct. 20, 2015, entitled TUNABLE METAMATERIAL SYSTEMS AND METHODS, and published as U.S. Pat. Pub. No. 2017/0069966; U.S. patent application Ser. No. 14/986,255, filed on Dec. 31, 2015, entitled WIRELESS POWER TRANSFER USING TUNABLE METAMATERIAL SYSTEMS AND METHODS, and published as U.S. Pat. Pub. No. 2017/0069969; U.S. patent application Ser. No. 14/986,258, filed on Dec. 31, 2015, entitled WIRELESS POWER TRANSFER USING TUNABLE METAMATERIAL SYSTEMS AND METHODS, and published as U.S. Pat. Pub. No. 2017/0069973; U.S. patent application Ser. No. 15/345,251, filed on Nov. 7, 2016, entitled MASSIVELY MULTI-USER MIMO USING SPACE TIME HOLOGRAPHY; U.S. patent application Ser. No. 15/409,394, filed on Jan. 18, 2017, entitled MASSIVELY MULTI-USER MIMO USING SPACE TIME HOLOGRAPHY; and U.S. patent application Ser. No. 15/722,973, filed on Oct. 2, 2017, entitled TIME REVERSAL BEAMFORMING TECHNIQUES WITH METAMATERIAL ANTENNAS are related to the present application. The content for each of foregoing applications and application publications is incorporated herein by reference.

TECHNICAL FIELD

The present technology pertains to a system and method of operation of a metamaterial phase shifter having various use applications including, but not limited to, antenna systems.

BACKGROUND

A phase shift module or a phase shifter is a device that receives an input signal such as a radio frequency electromagnetic signal and provides a controllable shift of the phase of the input signal. At microwave frequencies, phase shifters are usually implemented as microwave networks—electromagnetic circuits composed of transmission lines and various circuit elements, including controllable (tunable) elements. Phase shifters can be classified as active or passive, depending on whether signal magnitude is amplified. Phase shifters can be also classified as analog or digital, depending on whether they provide a continuous range or a discrete set of possible phase shifts. Example applications of phase shifters include phased array antennas, including electronically steerable arrays (ESA), software-defined antennas (SDA) and so on.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Various examples of the disclosure are discussed in detail below. While specific implementations are discussed, it should be understood that this is done for illustration purposes only. A person skilled in the relevant art will recognize that other components and configurations may be used without parting from the spirit and scope of the disclosure.

References to one or an example embodiment in the present disclosure can be, but not necessarily are, references to the same example embodiment; and, such references mean at least one of the example embodiments.

Reference to "one example embodiment" or "an example embodiment" means that a particular feature, structure, or characteristic described in connection with the example embodiment is included in at least one example of the disclosure. The appearances of the phrase "in one example embodiment" in various places in the specification are not necessarily all referring to the same example embodiment, nor are separate or alternative example embodiments mutually exclusive of other example embodiments. Moreover, various features are described which may be exhibited by some example embodiments and not by others. Similarly, various features are described which may be features for some example embodiments but no other example embodiments.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term likewise, the disclosure is not limited to various examples given in this specification.

Without intent to limit the scope of the disclosure, examples of instruments, apparatus, methods and their related results according to examples of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular examples only and is not intended to be limiting. As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of examples. However, it will be understood by one of ordinary skill in the art that examples may be practiced without these specific details. For example, systems may be shown in block diagrams so as not to obscure the examples in unnecessary detail. In other instances, well-known processes, structures and techniques may be shown without unnecessary detail in order to avoid obscuring examples.

In the following description, illustrative examples will be described with reference to acts and symbolic representations of operations (e.g., in the form of flow charts, flow diagrams, data flow diagrams, structure diagrams, block diagrams, etc.) that may be implemented as program services or functional processes include routines, programs, objects, components, data structures, etc., that perform particular tasks or implement particular abstract data types and may be implemented using hardware at network elements. Non-limiting examples of such hardware may include one or more Central Processing Units (CPUs), digital signal processors (DSPs), application-specific-integrated-circuits, field programmable gate arrays (FPGAs), computers or the like.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Overview

In one aspect of the present disclosure, a phase shifter includes a network of tunable impedance elements and a controller. The controller is coupled to the network of tunable impedance elements and configured to receive a phase shift input value and determine a corresponding tuning voltage to be supplied to each tunable impedance element of the network of tunable impedance elements based on the phase shift input value, the network of tunable impedance element being configured to shift a phase of an input signal based on tuning voltages supplied to the network of tunable impedance elements by the controller.

In one aspect of the present disclosure, a method includes receiving a phase shift input value, determining a set of voltage control signals based on the phase shift input value and transmitting the set of voltage control signals to a network of tunable impedance elements to shift a phase of an input signal to the phase shifter such that a magnitude of an output signal of the phase shifter and a magnitude of the input signal to the phase shifter are substantially similar.

DESCRIPTION

The disclosed technology is directed to the use of a network of tunable impedance elements in a phase shift module that is configured to change a phase of an input signal.

Figure 1:
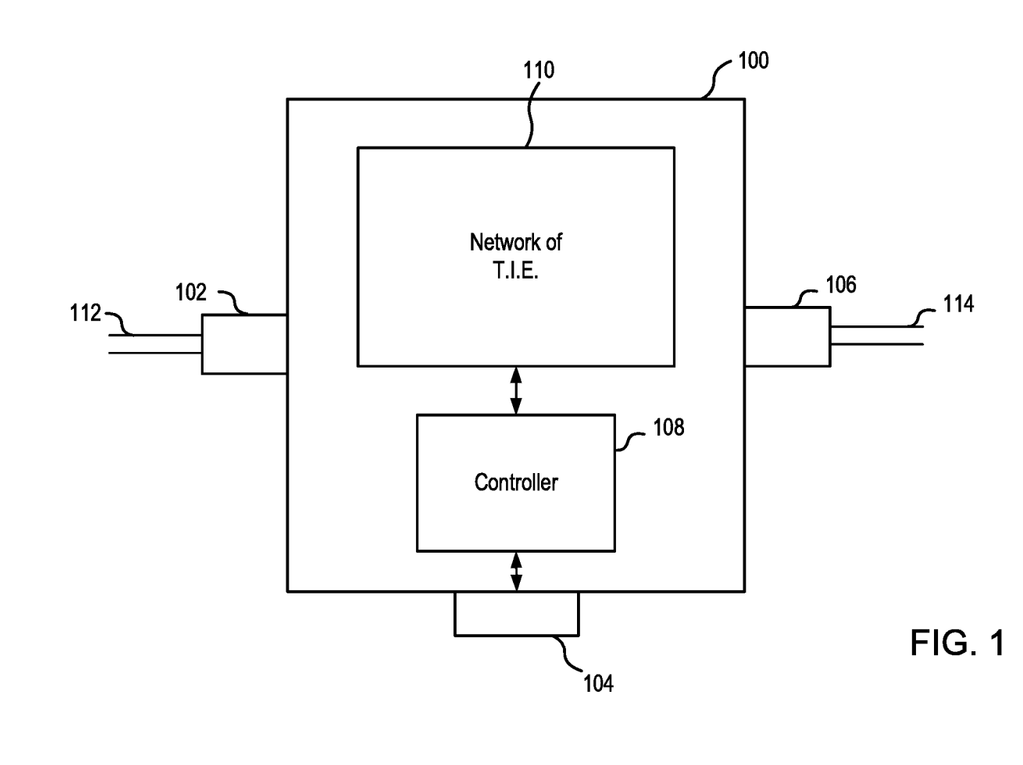
FIG. 1 illustrates a phase shift module, according to one aspect of the present disclosure.

FIG. 1 illustrates a phase shift module, according to one aspect of the present disclosure. As shown in FIG. 1, a phase shift module 100 (which may also be referred to as phase shifter 100) has an input port 102, control port 104, output port 106, controller 108 and a network of tunable impedance elements (network of T.I.E.) 110.

Phase shift module 100 has a housing that can be made of metal, plastic, etc. Input port 102 can be metallic or plastic for example. Phase shift module 100 can be a digital phase shift module. In another example, phase shift module 100 can be a single input-single output digital phase shift module.

Input port 102 can be such that a cable such as cable 112 can be screwed into, snapped into, attached to (magnetically for example), etc. Cable 112 can be any known or to be developed co-axial, etc., cable or wire capable of transmission of signals (e.g., radio frequency signals).

Control port 104 can have one or more pins for connection to an external component through which various commands for programming of controller 108 and overall operation of phase shift module 100 can be sent to phase shift module 100. For example, control port 104 can be a 16 pin input port with each pin having a specific function/purpose. For example, pin 0 can be ground, pin 1 can be input voltage, one or more pins can each designate a specific phase shift input value (e.g., 10 degrees, 30 degrees, 90 degrees, 180 degrees, 270 degrees, etc.), one or more pins can designate an operational frequency of phase shift module 100 from an operational bandwidth range (e.g., 0 to 18 GHz, etc.). Accordingly, phase shift module 100 can be a multiple-frequency device with an operational frequency selectable from such operational bandwidth range or alternatively, can be a single frequency device. In one example, phase shift module 100 is a finite-operational-bandwidth device, the operational frequency of which is selectable from an operation bandwidth range.

Output port 106 can be such that a cable such as cable 114 can be screwed into, snapped into, attached to (magnetically for example), etc. Cable 114 can be any known or to be developed co-axial, etc., cable or wire capable of transmitting a signal (e.g., a radio frequency (RF) signal), the phase of which has been shifted by phase shift module 100 to an intended destination depending on specific application to which phase shift module 100 is applied.

Each one of controller 108 and network of tunable impedance elements 110 will be further described with reference to FIGS. 2 and 3, respectively.

Figure 2:
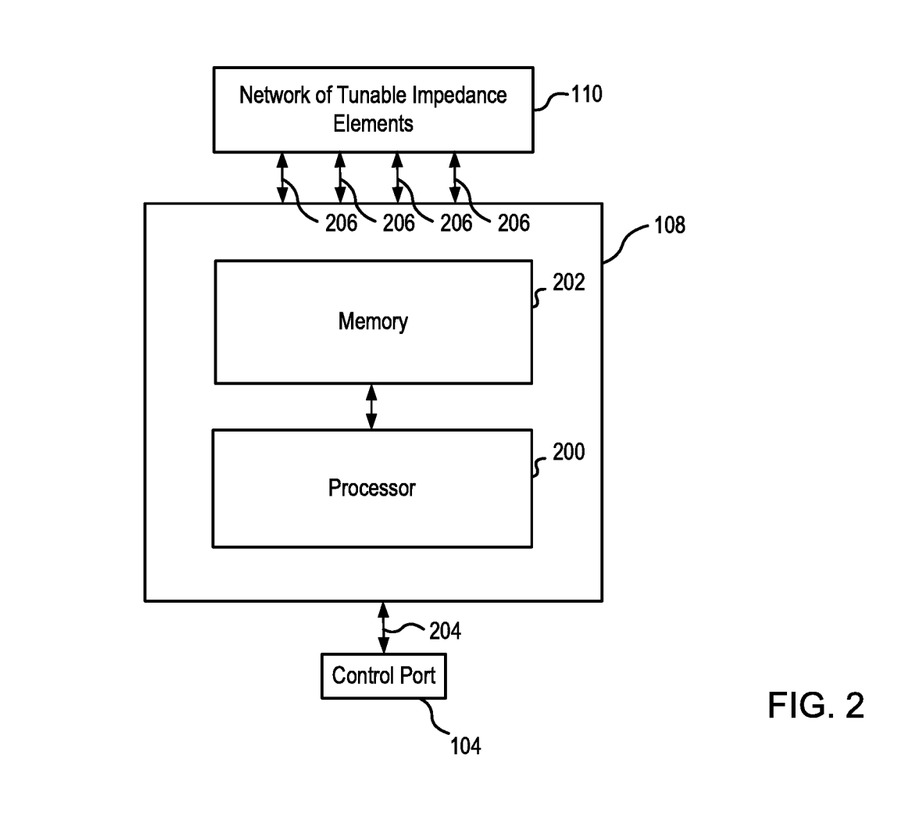
FIG. 2 illustrates a controller of the phase shift module, according to an aspect of the present disclosure.

FIG. 2 illustrates a controller of the phase shift module, according to an aspect of the present disclosure. As shown in FIG. 2, controller 108 can have a processor 200 and a memory 202. Memory 202 can have computer-readable instruction stored therein, which when executed by processor 200, transforms the processor 200 into a special purpose processor to perform functionalities for implementing a metamaterial based phase shifter, as will be further described below with reference to FIG. 4.

Furthermore, controller 108 can have one or more connection ports such as connection ports 204 and one or more connection ports 206 for communication with control port 104 and network of tunable impedance elements 110. Number of connection ports 204 and 206 are not limited to that shown in FIG. 2 and instead can be more or less. However, there is at least one of each control port 204 and 206.

For example, connection port 204 can be connected to control port 104 for receiving various commands such as input voltage, designated (requested) phase shift to be applied to an input signal, etc. In another example, connection port 206 is used to communicate various voltages (as will be described below with reference to FIG. 4) to network of tunable impedance elements 110. One or more connection port 206, as shown in FIG. 2 can be a plurality of control lines connecting controller 108 to network of tunable impedance elements 110. In one example, each of plurality of control lines 206 couples controller 108 to one tunable impedance element of network of tunable impedance elements 110.

Controller 108 can be a special purpose digital device, such as application-specific integrated circuits (ASIC), programmable array logic (PAL), programmable logic array (PLA), programmable logic device (PLD), field programmable gate array (FPGA), or other customizable and/or programmable device. Controller 108 can be installed on/attached to a printed circuit board (PCB) inside a housing of phase shift module 100. In such case, connections ports 204 and 206 can be one or more pins of an ASIC or FPGA connected to a common conductive line on the PCB for connection to respective one of input port 104, network of tunable impedance elements 110, etc.

Memory 202 can be any one of, but not limited to, a non-volatile memory, static RAM, dynamic RAM, ROM, CD-ROM, disk, tape, magnetic, optical, flash memory, or other machine-readable storage medium. Various aspects of certain embodiments may be implemented using hardware, software, firmware, or a combination thereof.

Figure 3A:
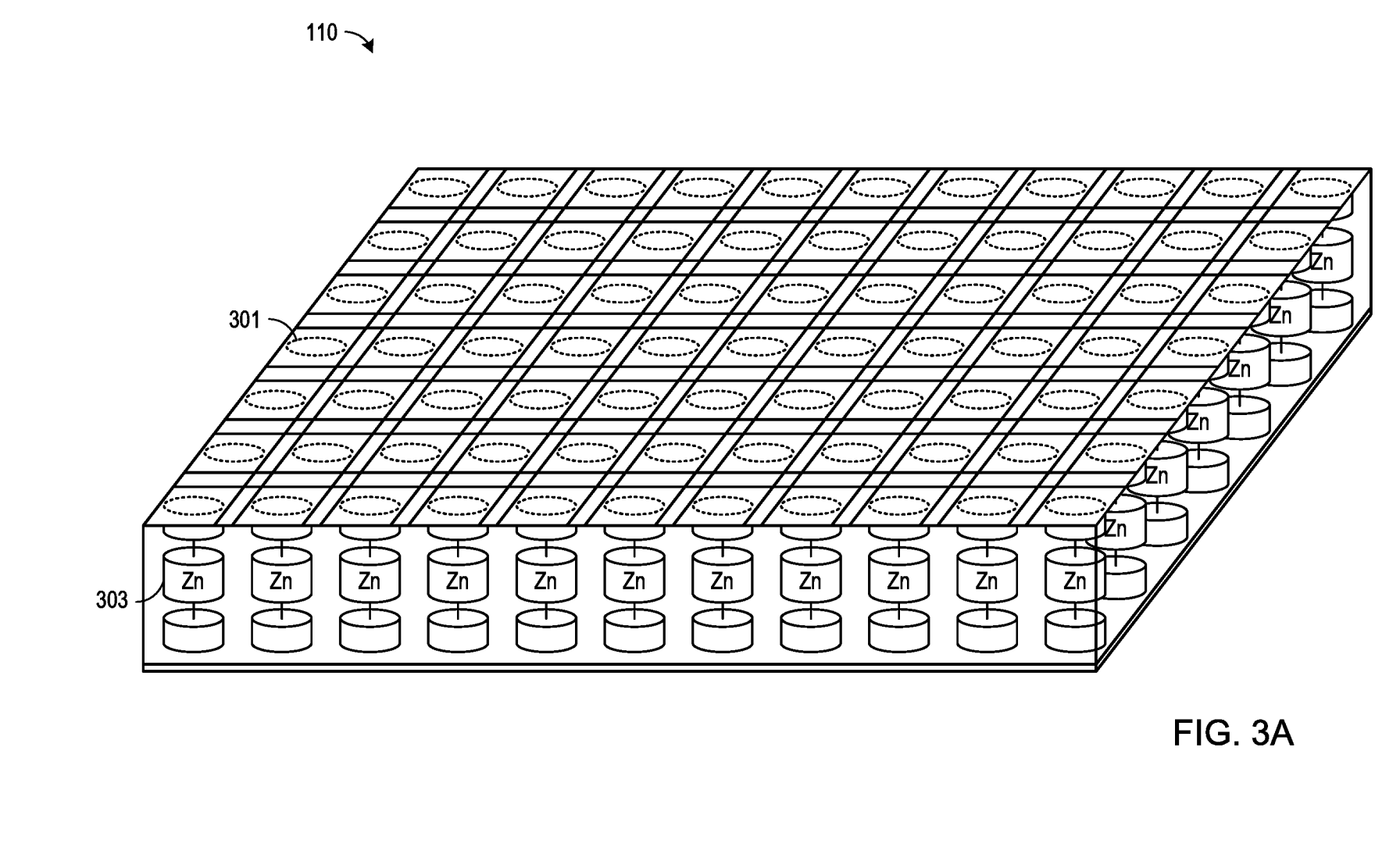
FIG. 3A illustrates a network of tunable impedance elements, according to one aspect of the present disclosure.

FIG. 3A illustrates a network of tunable impedance elements, according to one aspect of the present disclosure.

As shown in FIG. 3A, network of tunable impedance elements 110 can be associated with variable lumped impedance elements, Zn, 303 according to an aspect of the present disclosure.

In one example, a number of tunable impedance elements of network of tunable impedance elements 110 are proportional to a number of phase shift input values in a set of possible (available) phase shift input values of phase shift module 100, from which the phase shift input value is selected.

In another example, the number of tunable impedance elements of network of tunable impedance elements 110 is at least equal to twice the number of the phase shift input values.

In one example, each of the phase shift values are equally spaced on the $[0, 2\pi]$ interval. In one example, each of the phase shift input values are distributed on the $[0, 2\pi]$ interval in accordance with roots of a Legendre polynomial of a corresponding order.

Tunable metamaterials of network of tunable impedance elements 110, including two-dimensional metasurface devices, may comprise an array of unit cells. Each unit cell can have one or more variable impedance elements. Each impedance element or group of impedance elements may be variably controlled based on one or more impedance control inputs (control signals (tuning voltage values/inputs) received from controller 108, as will be described below). The tuning may be a one-time static tuning that is performed during the manufacturing of the antenna device, or the tuning may be a dynamic process that occurs during operation by modifying one or more control inputs (e.g., one or more requested phase shift value).

As an example of static tunability, a metamaterial device may be manufactured using a 3D printer and the tuning may comprise selecting a material or combination of materials that results in a specific electromagnetic or electrical property for each of the impedance elements. Therefore, each tunable impedance element of network of tunable impedance elements 110 can be said to be formed of electromagnetic metamaterial.

By uniquely selecting the material or combination of materials for each of the unit cells, a metamaterial antenna device may be statically tuned to provide a specific phase shift of an input RF signal. Alternatively, each unit cell may be modeled to include a lumped impedance element with (at least) one input and (at least) one output. The input(s) may be dynamically manipulated during operation to dynamically shift the phase of an input signal in real-time from a selectable set of phase shifts.

In one example, network of tunable impedance elements 110 can be a spatially-periodic arrangement of tunable impedance elements, with spatial periodicity in at least one spatial dimension being less than one-half of free-space wavelength. In another example, the special dimension can be in two special dimensions or in three special dimensions.

As previously described, the system may be modeled to include lumped impedance elements that can be passive, active, or variably passive-active. At a given frequency, each impedance element may be fully described by the complex value of its impedance "z." A positive integer N may be used to describe the number of tunable or variable lumped impedance elements. A diagonal square matrix of size N may have diagonal elements $z_n$ representative of the nth impedance element. Alternatively, an N-dimensional complex vector, $\{z_n\}$, can be used to represent the n-valued list of impedance values.

Each variable impedance element may be modeled as a port (e.g., a lumped port and/or a wave port). A plurality of lumped ports, N, may include a plurality of lumped input ports, $N_i$, with impedance values corresponding to the impedance values of each of the variable impedance elements, and at least one lumped external port, $N_e$, that may or may not have a variable impedance or any impedance at all. That is, the z value of the modeled lumped external port, $N_e$, may be zero and represent an idealized shorted port. Alternatively, the z value of the modeled lumped external port, $N_e$, may be infinity and represent an idealized open port. In many embodiments, the z value of the external port, $N_e$, may be a complex value with a magnitude between zero and infinity.

Regardless of the impedance values of each of the lumped ports, N, including the lumped input ports, $N_i$, and the at least one lumped external port, $N_e$, each of the lumped ports (or in some examples wave ports) may have its own self-impedance and the network of ports may be described by an N×N impedance matrix (Z-Matrix) or by the equivalent inverse admittance matrix (Y-Matrix) where $Y=Z^{-1}$. Additionally, the network of ports can be modeled as an S-parameter matrix or scattering matrix (S-Matrix). The Z-Matrix and its inverse the Y-Matrix are independent from the specific z values of the ports because the matrix elements are defined as $Z_{nm}=V_n/I_m$, where $V_n$ and $I_m$ are the voltage at port n and the current at port m, measured with all other ports open. That is, assuming port currents $I_k=0$ for all k not equal to m or n. Similarly, for the admittance matrix, $Y_{nm}=I_m/V_n$, measured with all other ports open. Again, that is assuming port currents $I_k=0$ for all k not equal to m or n.

The S-Matrix is expressible through the Z or Y matrices and the values of the lumped impedance elements as follows:

$$S=(\sqrt{y}Z\sqrt{y}-1)(\sqrt{y}Z\sqrt{y}+1)^{-1}=(1-\rho z\sqrt{z})(1+\sqrt{z}Y\sqrt{z})^{-1} \quad (1)$$

In the equation above, the "1" represents a unit matrix of size N. The S-Matrix models the port-to-port transmission of off-diagonal elements of the N-port network of impedance elements. In a lossless system, the S-Matrix is unitary. If elements $s_n$ are the singular values of the S-Matrix, which are the same as the magnitudes of the eigenvalues, it can be stated that in a lossless system, all $s_n=1$. In general, if $s_{max}$ is the largest singular value, then for a passive lossy system it can be stated that $s_n \le s_{max} \le 1$.

In an active system, these bounds still hold, however $s_{max}$ can now exceed unity, representing an overall 2^N gain for at least one propagation path. The Z and Y matrices are diagonalized in the same basis represented by a unitary matrix U ($U^\dagger=U^{-1}$), such that $Z=U^\dagger Z_d U$, $Y=U^\dagger Y_d U$, where the subscript d indicates a diagonal matrix, the elements of which are complex-valued eigenvalues of the corresponding matrix.

Generally speaking, unless √Z is proportional to a unit matrix (i.e., all lumped element impedances are equal), the S-Matrix will not be diagonal in the U-basis. In the U-basis, the general form of the S-Matrix is $S=U^\dagger(1-\zeta Y_d\zeta)(1+\zeta Y_d\zeta)^{-1}U$, where a new non-diagonal matrix $\zeta=U\sqrt{z}U^\dagger$ is used such that $\sqrt{z}=U^\dagger\zeta U$, and $Y_d$ is diagonal, though not generally commutative with $\zeta$.

The S-Matrix of the system can be numerically evaluated with any desired accuracy by solving exactly N linear system problems (e.g., $Z_{nm}=V_n/I_m$ or $Y_{nm}=I_m/V_n$ and the associated open port conditions described above). Such problems may be solved with Finite Element Methods (FEM) or finite-difference time-domain (FDTD) based solvers for linear electromagnetic systems. Examples of commercially available solvers include ANSYS HFSS, COMSOL, and CST. These numerical simulations incorporate various fine effects of the near-field and far-field interactions between various parts of the system, regardless of complexity.

The Z-Matrix and/or the Y-Matrix can be evaluated based on knowledge of the S-matrix and the impedance values. With many FEM solvers, it is also possible to directly evaluate the Z-Matrix or the Y-Matrix, by solving $N^2$ linear problems. This approach, however, is N times less efficient than calculating the S-Matrix with a fixed set of port impedance values (known as reference impedance values), and transforming it to Z and/or Y.

In one or more examples, each tunable impedance element of the network of tunable impedance elements 110 can have a maximum dimension that is less than half of a wavelength of the smallest frequency within an operating frequency range (e.g., between 0 to 18 GHz). One or more of the sub-wavelength tunable impedance elements may comprise a resonating element. In one or more examples, some or all of the sub-wavelength tunable impedance elements may comprise metamaterials. In one or more examples, a network of tunable impedance elements (e.g., resonating elements) may be collectively considered a metamaterial.

Network of tunable impedance elements 110 can have inter-element spacings that are substantially less than a free-space wavelength corresponding to an operating frequency or frequency range. For example, the inter-element spacings may be less than one-half or one-quarter of the free-space operating wavelength. Network of tunable impedance elements 110 may be configured to operate in a wide variety of operating frequency ranges, including, but not limited to, microwave frequencies (e.g., 0 to 18 GHz or any other frequency range). The presently described systems and methods may be adapted for use with other frequency bands, including those designated as very low frequency, low frequency, medium frequency, high frequency, very high frequency, ultra-high frequency, super-high frequency, and extremely high frequency or millimeter waves.

Network of tunable impedance elements 110 can be connected to input port 102, which can be a common transmission line (TL). Alternative waveguides can be used instead of or in addition to TLs. A waveguide or TL may be modeled as another port in the S-Matrix, such as in Heretic-like architectures with variable couplers.

The impedance of each of the lumped impedance elements may be variably adjusted through one or more impedance control inputs (tuning voltage values) received from controller 108, as will be described below.

In one or more examples, the lumped external port, $N_e$, may comprise a virtual port, an external region of space assumed to be a void, a region of space assumed to be filled with a dielectric material, and/or a location in space assumed to be filled with a conductive, radiative, reactive, and/or reflective material.

The lumped external port, $N_e$, may also be modeled as a virtual external port, comprising a field probe, as measured by a non-perturbing measurement. In other example, the virtual external port may represent a numerical field probe, as calculated using a numerical simulation.

In one or more examples, the impedance of each one of the network of tunable impedance elements 110 may be controlled individually, or only some of them may be variable. In any of the above embodiments, X impedance control inputs may be varied to control the impedance of Y impedance elements, where X and Y are integers that may or may not be equal.

As a specific example, 1,000 unique impedance control inputs may be provided for each of 1,000 unique impedance elements of the network of tunable impedance elements 110. Accordingly, each of the impedance control inputs (tuning voltages) may be varied to control the impedance of each of the impedance elements in network of tunable impedance elements 110.

In some examples, one or more of the impedance control inputs (tuning voltages) may utilize the application of a direct current (DC) voltage to variably control the impedance of the elements of network of tunable impedance elements 110 based on the magnitude of the applied DC voltage. In other examples, an impedance control input may utilize one or more of an electrical current input, a radiofrequency electromagnetic wave input an optical radiation input, a thermal radiation input, a terahertz radiation input, an acoustic wave input, a phonon wave input, a mechanical pressure input, a mechanical contact input, a thermal conduction input, an electromagnetic input, an electrical impedance control input, and a mechanical switch input. In one or more examples, the lumped impedance elements may be modeled as two-port structures with an input and an output.

The lumped impedance elements may comprise one or more of a resistor, a capacitor, an inductor, a varactor, a diode, a Micro-Electro-Mechanical Systems (MEMS) capacitor, a Barium Strontium Benatate (BST) capacitor, a tunable ferroelectric capacitor, a tunable MEMS inductor, a pin diode, an adjustable resistor, a High Electron Mobility Transistor (HEMT), and/or another type of transistor. Any of a wide variety of alternative circuit components (whether in discrete or integrated form) may be part of a lumped impedance element (e.g., network of tunable impedance elements 110).

One or more hardware, software, and/or firmware solutions may be employed to perform operations for controlling an implementing a phase shift of input signals using network of tunable impedance elements 110 using phase shift module 100, as will be described below. For instance, a computer-readable medium (e.g., a non-transitory computer-readable medium) may have instructions that are executable by a processor to provide control voltages by controller 108 to tunable impedance elements of network of tunable impedance elements 110. The executed operations or method steps may include determining a scattering matrix (S-Matrix) of field amplitudes for each tunable impedance element of network of tunable impedance elements 110.

As described above, S-Matrix is expressible in terms of an impedance matrix, Z-Matrix, with impedance values, $Z_n$, of each of each impedance element of network of impedance elements 110, N. Thus, by modifying one or more of the impedance values, $z_n$, associated with one or more of N impedance elements, a desired S-Matrix of field amplitudes can be attained.

Determining an optimized $\{z_n\}$ may include calculating an optimized Z-Matrix using one or more of a variety of mathematical optimization techniques. For example, the optimized $\{z_n\}$ may be determined using a global optimization method involving a stochastic optimization method, a genetic optimization algorithm, a Monte-Carlo optimization method, a gradient-assisted optimization method, a simulated annealing optimization algorithm, a particle swarm optimization algorithm, a pattern search optimization method, a Multistart algorithm, and/or a global search optimization algorithm. Determining the optimized $\{z_n\}$ may be at least partially based on one or more initial guesses. Depending on the optimization algorithm used, the optimized values may be local optimizations based on initial guesses and may not in fact be true global optimizations. In other embodiments, sufficient optimization calculations are performed to ensure that a true globally optimized value is identified. In some embodiments, a returned optimization value or set of values may be associated with a confidence level or confidence value that the returned optimization value or set of values corresponds to global extrema as opposed to local extrema.

For gradient-assisted optimization, a gradient may be calculated analytically using an equation relating an S-parameter of the S-Matrix to the Z-Matrix and the optimized $\{z_n\}$. In some examples, a Hessian matrix calculation may be utilized that is calculated analytically using the equation relating the S-parameter to the Z-Matrix and the optimized $\{z_n\}$. A quasi-Newton method may also be employed in some embodiments. In the context of optimization, the Hessian matrix may be considered a matrix of second derivatives of the scalar optimization goal function with respect to the optimization variable vector.

In some examples, the global optimization method may include exhaustively or almost exhaustively determining all local extrema by solving a multivariate polynomial equation and selecting a global extrema from the determined local extrema. Alternative gradient-based methods may be used, such as conjugate gradient (CG) methods and steepest descent methods, etc. In the context of optimization, a gradient may be a vector of derivatives of the scalar optimization goal function with respect to the vector of optimization variables.

Exhaustively determining all local extrema may be performed by splitting the domain based on expected roots and then splitting it into smaller domains to calculate a single root or splitting the domain until a domain with a single root is found. Determining the optimized $\{z_n\}$ may include solving the optimization problem in which a simple case may include a clumped function scalar function with one output and N inputs. The N inputs could be complex $z_n$ values and the optimized Z-Matrix may be calculated based on an optimization of complex impedance values of the $z_n$ vectors.

The optimized $\{z_n\}$ may be calculated by finding an optimized Z-Matrix based on an optimization of complex impedance values $z_n$. The optimized $\{z_n\}$ may be calculated by finding an optimized Z-Matrix based on an optimization of roots of complex values of the impedance values $z_n$. The optimized $\{z_n\}$ may be calculated by finding an optimized Z-Matrix based on an optimization of reactances associated with the impedance values of the impedance values $z_n$. The optimized $\{z_n\}$ may be calculated by finding an optimized Z-Matrix based on an optimization of resistivities associated with the impedance values of the impedance values $z_n$. The optimization may be constrained to allow only positive or inductive values of reactances, or only negative or capacitive values of reactances. In other embodiments, the optimization of resistivities may be constrained to only allow for positive or passive values of resistivities.

The optimized $\{z_n\}$ may be calculated by finding an optimized Z-Matrix based on an optimization of the impedance control inputs associated with the lumped impedance elements of each of the sub-wavelength antenna elements. The optimized $\{z_n\}$ may be calculated by optimizing a nonlinear function. The nonlinear function may relate impedance values for each of the lumped antenna ports, $N_a$, as modeled in the S-Matrix and the associated impedance control inputs. In some embodiments, the nonlinear function may be fitted to a lower-order polynomial for optimization.

Mapping the Z-Matrix values to the S-Matrix values may comprise a non-linear mapping. In some instances, the mapping may be expressible as a single- or multivariate polynomial. The polynomial may be of a relatively low order (e.g., 1-5). The S-Matrix may comprise N values and the Z-Matrix may comprise M values, where N and M are both integers and equal to one another, such that there is a 1:1 mapping of S-Matrix values and Z-Matrix values. Any of a wide variety of mappings is possible. For example, the S-Matrix may comprise N values and the Z-Matrix may comprise M values, where N squared is equal to M. Alternatively, there may be a 2:1 or 3:1 mapping or a 1:3 or 2:1 mapping.

The physical location of the at least one lumped external port, $N_e$, may be associated with a single-path or multipath propagation channel that is electromagnetically reflective and/or refractive. The multipath propagation channel may be in the near-field. In a radiative near-field, the multipath propagation pattern may be in the reactive near-field.

Determining the optimized $\{z_n\}$ of impedance values for network of tunable impedance elements 110 may include determining an optimized set of control values for the plurality of impedance control inputs that results in an field amplitude for the at least one lumped external port, $N_e$, in the S-Matrix that approximates the target field amplitude for a given operating frequency or frequency range.

The S-Matrix element $S_{1N}$ represents the complex magnitude of field (e.g., electric field) at a particular location in space, given by the radius vector $\vec{r}_0$, normalized to the field magnitude at the input port. The absolute value $|S_{1N}|$, or the more algebraically convenient quantity $|S_{1N}|^2$, quantifies the quality of field concentration at that point. Maximizing this quantity (or minimizing in the case of forming nulls) represents a generalized phase shifting algorithm.

To find all local optima and the global optimum we can use the equation $q_n = \sqrt{z_n}$, which characterizes the individual port impedances $z_n$. The equation above, $S = U\vec{r}_0 (1-\zeta Y_d \zeta)(1+\zeta Y_d \zeta)^{-1} U$, is a rational (and meromorphic) analytical function of $\{q_n\}$.

To make this function bounded, and find its maxima that are attainable in a passive system, the function may be restricted to the multidimensional segment satisfying $\mathrm{Re}(z_n) \geq 0$, $n=1, \ldots, N$. Equivalently, this condition is $-\pi/2 \leq \arg z_n \leq \pi/2$, and consequently $-\pi/4 \leq \arg q_n \leq \pi/4$.

To reduce this problem to real values, each $q_n$ variable can be expressed through real variables, $q_n = \rho_n + i\xi_n$. In this manner, the real valued function $|S_{1N}|^2$ is now a function of 2N real variables $\rho_n, \xi_n$, which is a rational function comprising a ratio of two 2N-variate polynomials.

In some examples, the resistance of each lumped element can be neglected by assuming $\mathrm{Re}(z_n)=0$, $z_n = ix_n$, with the real reactance values $x_n$. In some examples, the system as a whole is still assumed passive and lossy with the losses occurring on the paths between the ports and incorporated into the Z-Matrix (or Y-Matrix). This approximation satisfies the passivity constraints and also reduces the number of variables to N because $\sqrt{z}Y\sqrt{z} \to i\sqrt{x}Y\sqrt{x}$, and x is purely real.

The function $|S_{1N}|^2$ is necessarily bounded for a passive system, and therefore it has a finite global maximum as a function of real-valued variables $\rho_n, \xi_n$. Moreover, it has a finite number of local extrema. These extrema can be found by solving a set of 2N multivariate polynomial equations given by the standard zero gradient condition at the extremum:

$$\frac{\partial |S_{1N}|^2}{\partial \rho_n} = 0, \quad \frac{\partial |S_{1N}|^2}{2\xi_n} = 0 \qquad (2)$$

With $n = 1, \ldots, N$.

In the simplified approach above, there are N unknowns $x_n = \sqrt{x_n}$ and N extremum conditions, so $$\frac{\partial |S_{1N}|^2}{\partial \chi_n} = 0 \qquad (3)$$

With $n = 1, \ldots, N$.

Once these extrema are found, the extremal values of the function are evaluated numerically, and the global maximum is determined by choosing the largest local maximum. A similar approach can be performed to identify one or more minimums to attain a target radiation pattern with a null at one or more specific radius vectors {right arrow over ($r_0$)}.

Numerical and symbolic-manipulation algorithms exist that take advantage of the polynomial nature of the resulting equations. For example, Wolfram Mathematica™ function Maximize supports symbolic solving of the global optimization problem for multivariate polynomial equations, unconstrained or with multivariate polynomial constraints. This function is based on a Groebner-basis calculation algorithm, which reduces the multidimensional polynomial system to a triangular system, which is then reduced to a single scalar polynomial equation by back-substitution. Similar functionality exists in other software packages, including MATLAB™ with Symbolic Math Toolbox™, Maple™ and so on.

As previously discussed, once values are determine for each of the $z_n$ for the variable or tunable impedance elements of network of tunable impedance elements 110, each of the impedance elements can be tuned. In some examples, the tuning is static and the impedance values are set at the manufacturing stage. In other examples, a physical stimulus (e.g., mechanical, electric, electromagnetic, and/or a combination thereof) may be used to dynamically tune impedance elements to dynamically modify the radiation pattern of the antenna system during operation.

Depending on the manufacturing techniques employed (e.g., 3D printing) the calculated values of optimum impedance values may translate trivially into the choices made for the selectable impedance elements. In contrast, for the dynamically adjustable, variable, or tunable impedance elements, there is generally a non-trivial relationship between the complex impedance of the elements and the stimuli that control them. In some embodiments, the relationship between the complex impedance of the impedance elements and the control inputs may be based on a magnitude of an applied signal. Appreciating that the magnitude of the stimulus may be binary in some embodiments (i.e., on or off), the relationship may be modeled as $z_n = f_n(s_n)$, where $s_n$, is the real-valued magnitude of the stimulus. The function $f_n(s_n)$ can be fitted with a polynomial order S, and substituted into $|S_{1N}|^2$. The functions $f_n$ can be all the same when identical dynamically tunable elements are used, in which case there will be N extremum conditions for N real variables $s_n$, each of which is still a rational function.

In the lowest-order approximation, the fitting polynomial can be linear (S=1), in which case the complexity of the extremum problem is still $$\frac{\partial |S_{1N}|^2}{\partial \chi_n} = 0 \tag{3}$$

With $n = 1, \ldots, N$.

The quality of a polynomial approximation depends greatly on the practically available range of the stimulus, or the range chosen for other practical considerations. Because the $s_n$ variables are restricted to a finite interval, the optimization problem can be solved with the corresponding constraints. When the optimization problem is solved by exhaustive enumeration of the extrema, these constrains are applied trivially and the local extrema not satisfying the constraints are excluded from the enumeration.

As previously described, tunable impedance elements of network of tunable impedance elements 110 may have inter-element spacings that are substantially less than a free-space wavelength corresponding to an operating frequency of phase shift module 100. For example, the inter-element spacings may be less than one-half or one-quarter of the free-space operating wavelength. As shown, a common TL (via input port 102) may be coupled to network of tunable impedance elements. Each impedance element of network of impedance elements 110 may have a variable impedance value that is set during manufacture or that can be dynamically tuned via one or more control inputs.

Figure 3B:
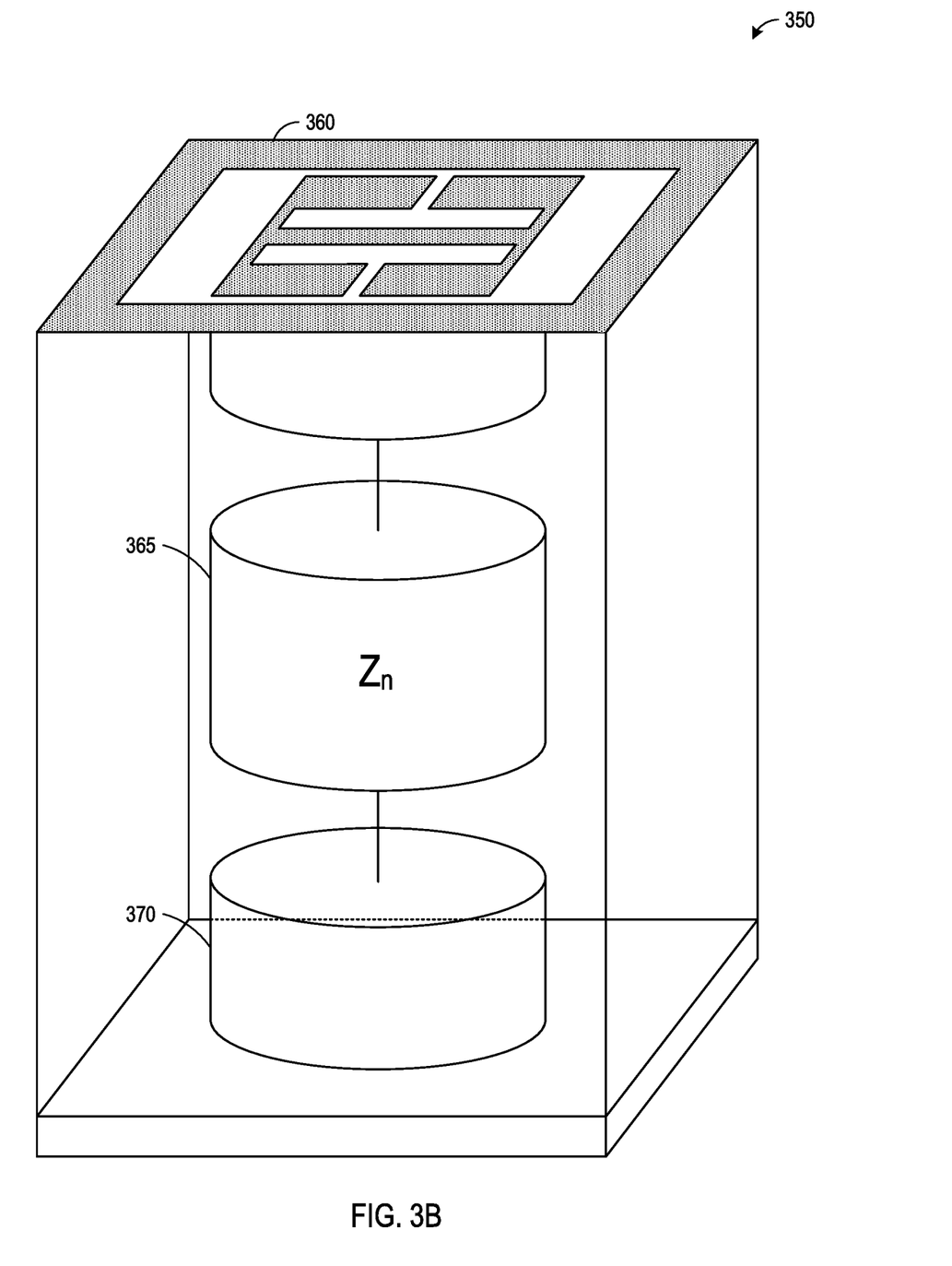
FIG. 3B illustrates a close-up view of a single tunable impedance element of network of tunable impedance elements of FIG. 1, according to an aspect of the present disclosure.

FIG. 3B illustrates a close-up view of a single tunable impedance element of network of tunable impedance elements of FIG. 1, according to an aspect of the present disclosure. In the close-up view 350, tunable impedance value $z_n$, 365, of a tunable impedance element 360 of network of tunable impedance elements 110 can have an impedance control input 370, through which a corresponding tuning voltage (voltage control signal) is received from controller 108, as will be described below. Impedance control input 370 can be used to control or vary the impedance of the lumped impedance element, $z_n$, 365 to achieve a desired phase shift indicated by a phase shift input value.

Figure 4:
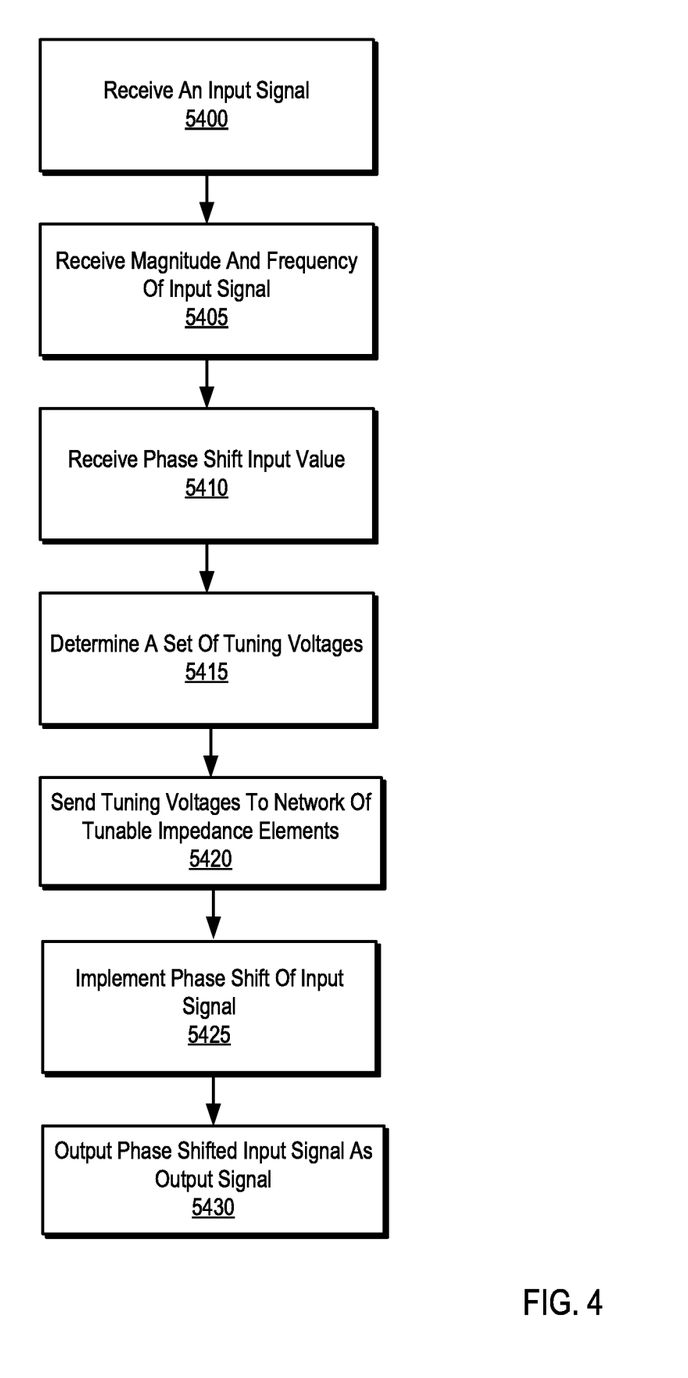
FIG. 4 is a flow chart of a method of operation of the phase shift module, according to one aspect of the present disclosure.

FIG. 4 is a flow chart of a method of operation of the phase shift module, according to one aspect of the present disclosure. FIG. 4 will be described from the perspective of phase shift module 100. However, one or more specific steps are performed by controller 108 of phase module 100 while one or more other specific steps are performed by network of tunable impedance elements 110, as will be described below.

At S400, phase shift module 100 receives an input signal. As described above, the input signal can be a continuous-wave signal having a particular magnitude and/or frequency. The input signal can be a continuous-wave radio frequency (RF) signal.

At S405, phase shift module 100 receives the magnitude and/or frequency of the input signal. In one example, phase shift module 100 receives only the magnitude or the frequency of the input signal. In another example, phase shift module 100 receives both the magnitude and frequency of the input signal. In another example, phase shift module does not receive any one of the magnitude or frequency of the input signal. In such case, step S405 is not performed.

In one example, upon receiving input signal at S400, phase shift module 100, via controller 108, determines the magnitude (e.g., local magnitudes of the input signal) and frequency of the input signal according to any known or to be developed method.

At S410, phase shift module 100 receives a phase shift input value. As described above, the phase shift input value is a desired value by which the phase of the input signal is to be shifted. In one example, the phase shift input value is received at controller 108 via control port 104.

In one example, the phase shift module 100 has an array of possible (available) phase shift values stored thereon (e.g., stored on a memory associated with controller 108). This array or set of possible phase shift values can be a finite set. Accordingly in one example, phase shift module, via controller 108, receives a digital input (an integer input) that corresponds to an index of one phase shift input value of the set stored in phase shift module 100. Based on the received integer input (index), phase shift module 100 determines the corresponding phase shift input value to be used.

In one example, the set possible phase shift input values has $2^M$ possible phase shift values, where M is the number of bits used to enumerate the phase shift values.

In one example, phase shift module 100 can be a 1 bit phase shifter and therefore, the finite set of possible phase shift values has only two possible phase shift values (e.g., 1 or 0).

At S415, phase shift module 100, via controller 108, determines a set of tuning voltages (voltage control signals) for network of tunable impedance elements 110 based on the phase shift input value received at S410.

In one example and as part of determining each tuning voltage for elements of network of impedance elements 110, controller 108 determines the corresponding tuning voltage for each tunable impedance element of network of tunable impedance elements 110 based on an approximation of network of tunable impedance elements 110 as a network of lumped ports, as described above, with characteristic impedances representing impedance values of tunable impedance elements of the network.

In one example, controller 108 performs the approximation by determining a scattering matrix (S-Matrix) of the network of lumped ports for a given set of characteristic impedances of lumped ports, as described above.

In one example, controller 108 determines the S-Matrix, as described above (e.g., equation (1)) and based on an impedance matrix of the network of lumped ports and the characteristic impedances of the lumped ports.

In one example, controller 108 determines the corresponding tuning voltage for each tunable impedance element of network of tunable impedance elements 110 such that a magnitude of an output signal at output port 106 and the magnitude of the input signal at input port 102 are substantially equal (e.g., a ratio between the magnitude of the output signal and the magnitude of the input signal, $|S_{21}|$, does not device from 1 by more than a threshold, where the threshold can be any value such as 1 dB, 3 dB, etc.).

In one example, controller 108 determines the corresponding tuning voltage for each tunable impedance element of network of tunable impedance elements 110 such that a ratio of a magnitude of an output signal at output port 106 to the magnitude of the input signal at input port 102, $|S_{21}|$, is constant.

In one example, controller 108 determines the corresponding tuning voltage for each tunable impedance element of network of tunable impedance elements 110 such that a ratio of a magnitude of an output signal at output port 106 to the magnitude of the input signal at input port 102, $|S_{21}|$, is greater than any one of 0.7, 0.8 or 0.9 for all possible/available phase shift input values of phase shift module 110.

In another example, at S415, phase shift module 100, via controller 108, determines a set of tuning voltages for network of tunable impedance elements 110 based on the phase shift input value received at S410 and the frequency of the input signal received at S405. For example, controller 108 determines a corresponding tuning voltage to be supplied to each tunable impedance element of network of tunable impedance elements 110 based on a dependency of impedances of tunable impedance elements and impedances of non-tunable branches of network of the network of tunable impedance elements 110 on the frequency of the input signal.

In another example, phase shift module 100, via controller 108, determines a set of tuning voltages for network of tunable impedance elements 110 based on the phase shift input value received at S410 and the magnitude of the input signal received at S405. For example, controller 108 determines a corresponding tuning voltage to be supplied to each tunable impedance element of network of tunable impedance elements 110 based on a dependency of impedances of tunable impedance elements and impedances of non-tunable branches of network of the network of tunable impedance elements 110 on the local magnitude of RF voltage or current of the input signal.

In another example, phase shift module 100, via controller 108, determines a set of tuning voltages for network of tunable impedance elements 110 based on the phase shift input value received at S410 and the frequency and the magnitude of the input signal received at S405 the local magnitude of RF voltage or current of the input signal.

After determining, at S415, tuning voltages for impedance elements of network of impedance elements 110, at S420, controller 108 sends the determined tuning voltage to corresponding impedance elements of network of impedance elements 110 via corresponding control lines 206 of FIG. 2.

At S425, network of impedance elements 110 implements a phase shift process for shifting the phase of the input signal according to the phase shift input value using the received tuning voltages.

At S430, phase shift module 100 outputs the phase shifted input signal as an output signal at output port 106.

Having described various examples of structure and operation of phase shift module 100, it should be noted that phase shift module 100 can have many different applications including but not limited to, an antenna system.

For clarity of explanation, in some instances the present technology may be presented as including individual functional blocks including functional blocks comprising devices, device components, steps or routines in a method embodied in software, or combinations of hardware and software.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" refers to at least one of a set and indicates that one member of the set or multiple members of the set satisfy the claim. For example, claim language reciting "at least one of A and B" means A, B, or A and B.

We claim:

1. A phase shifter, comprising:
a network of tunable impedance elements; and
a controller coupled to the network of tunable impedance elements and configured to:
receive a phase shift input value; and
determine a corresponding tuning voltage to be supplied to each tunable impedance element of the network of tunable impedance elements based on the phase shift input value, the network of tunable impedance elements being configured to shift a phase of an input signal based on tuning voltages supplied to the network of tunable impedance elements by the controller;
wherein the network of tunable impedance elements comprises a spatially-periodic arrangement of tunable impedance elements, with spatial periodicity in at least one spatial dimension being less than one-half of free-space wavelength.

2. The phase shifter of claim 1, wherein the controller is configured to receive the phase shift input value by receiving an integer input corresponding to an index of a corresponding phase shift input value in a finite set of available phase shift values.

3. The phase shifter of claim 2, wherein the finite set of available phase shift values has 2-to-the-power-of-M possible phase shift values.

4. The phase shifter of claim 2, wherein the finite set of available phase shift values contains two phase shift values.

5. The phase shifter of claim 2, wherein a number of tunable impedance elements of the network of tunable impedance elements is proportional to a cardinal number of the finite set of available phase shift values.

6. The phase shifter of claim 2, wherein the number of tunable impedance elements of the network of tunable impedance elements is at least equal to twice the number of the phase shift input values.

7. The phase shifter of claim 6, wherein each of the phase shift input values are equally spaced on the [0, 2π] interval.

8. The phase shifter of claim 6, wherein each of the phase shift input values are distributed on the [0, 2π] interval in accordance with roots of a Legendre polynomial of a corresponding order.

9. The phase shifter of claim 1, wherein the spatial periodicity is in two spatial dimensions.

10. The phase shifter of claim 1, wherein the spatial periodicity is in three spatial dimensions.

11. The phase shifter of claim 1, wherein the phase shifter is a single-frequency device.

12. The phase shifter of claim 11, wherein the controller is configured to determine the corresponding tuning voltage for each tunable impedance element of the network of tunable impedance elements such that the ratio of the magnitude of the output signal of the network of tunable impedance elements to the magnitude of the input signal of the network of tunable impedance elements is greater than 0.7, 0.8 or 0.9 for all possible phase shift input values.

13. The phase shifter of claim 1, wherein the phase shifter is a multiple-frequency device with an operational frequency selectable from a set of operational frequency values.

14. The phase shifter of claim 1, wherein:
the input signal is a continuous-wave signal, and
the controller is further configured to:
receive an input specifying a frequency of the continuous-wave signal, and
determine the corresponding tuning voltage to be supplied to each tunable impedance element of the network of tunable impedance elements based on a dependency of impedances of the tunable impedance elements and impedances of non-tunable branches of the network of tunable impedance elements on the frequency of the continuous-wave signal.

15. The phase shifter of claim 1, wherein:
the input signal is a continuous-wave signal, and
the controller is further configured to:
receive an input specifying a magnitude of the continuous-wave signal, and
determine the corresponding tuning voltage to be supplied to each tunable impedance element of the network of tunable impedance elements based on dependency of impedances of the tunable impedance elements and impedances of non-tunable branches of the network of tunable impedance elements on at least one local magnitude of radio frequency voltage or current of the continuous-wave signal.

16. The phase shifter of claim 1, wherein:
the input signal is a continuous-wave signal, and
the controller is further configured to:
receive an input specifying a frequency of the continuous-wave signal,
receive an input specifying a magnitude of the continuous-wave signal, and
determine the corresponding tuning voltage to be supplied to each tunable impedance element of the network of tunable impedance elements based on dependency of impedances of the tunable impedance elements and impedances of non-tunable branches of the network of tunable impedance elements on the frequency and at least one local magnitude of radio frequency voltage or current of the continuous-wave signal.

17. The phase shifter of claim 1, wherein the controller is configured to determine the corresponding tuning voltage for each tunable impedance element based on an approximation of the network of tunable impedance elements as a network of lumped ports with characteristic impedances representing impedance values of tunable impedance elements of the network.

18. The phase shifter of claim 17, wherein the controller is configured to perform the approximation by determining a scattering matrix of the network of lumped ports for a given set of characteristic impedances of lumped ports.

19. The phase shifter of claim 18, wherein the controller is configured to determine the scattering matrix based on an impedance matrix of the network of lumped ports and the characteristic impedances of the lumped ports.

20. The phase shifter of claim 1, wherein the controller is configured to determine the corresponding tuning voltage for each tunable impedance element of the network of tunable impedance elements such that a magnitude of an output signal of the network of tunable impedance elements and a magnitude of an input signal to the network of tunable impedance elements are substantially equal.

21. The phase shifter of claim 1, wherein the controller is configured to determine the corresponding tuning voltage for each tunable impedance element of the network of tunable impedance elements such that a ratio of a magnitude of an output signal of the network of tunable impedance elements to a magnitude of an input signal to the network of tunable impedance elements is approximately constant for all possible phase shift input values.

22. The phase shifter of claim 1, wherein the network of tunable impedance elements has non-negligible mutual coupling between at least one pair of tunable impedance elements.

23. The phase shifter of claim 1, wherein the network of tunable impedance elements comprises an electromagnetic metamaterial.

24. The phase shifter of claim 1, wherein the spatial periodicity is in one spatial dimension.

25. The phase shifter of claim 1, wherein the phase shifter is a finite-operational-bandwidth device with an operational frequency selectable from an operational bandwidth range.

26. The phase shifter of claim 1, further comprising:
an input coupled to the network of tunable impedance elements and configured to receive the input signal; and
an output coupled to the network of tunable impedance elements and configured to output an output signal, the output signal being a phase shifted version of the input signal.

27. A method of operating a phase shifter, comprising:
receiving a phase shift input value;
determining a set of voltage control signals based on the phase shift input value; and
transmitting the set of voltage control signals to a network of tunable impedance elements to shift a phase of an input signal to the phase shifter such that a magnitude of an output signal of the phase shifter and a magnitude of the input signal to the phase shifter are substantially similar;
wherein the network of tunable impedance elements comprises a spatially-periodic arrangement of tunable impedance elements, with spatial periodicity in at least one spatial dimension being less than one-half of free-space wavelength.

28. The method of claim 27, wherein the controller is configured to receive the phase shift input value by receiving an integer input corresponding to an index of a corresponding phase shift input value in a finite set of available phase shift values.

29. The method of claim 27, wherein the network of tunable impedance elements has non-negligible mutual coupling between at least one pair of tunable impedance elements.

30. The method of claim 27, wherein the network of tunable impedance elements comprises an electromagnetic metamaterial.

31. The method of claim 27, wherein the phase shifter is a finite-operational-bandwidth device with an operational frequency selectable from an operational bandwidth range.

32. The method of claim 27, wherein the phase shifter is a multiple-frequency device with an operational frequency selectable from a set of operational frequency values.

33. The method of claim 27, wherein
the input signal is a continuous-wave signal, and
the method further comprises:
receiving an input specifying a frequency of the continuous-wave signal, and
determining a corresponding one of the set of voltage control signals to be supplied to each tunable impedance element of the network of tunable impedance elements based on a dependency of impedances of the tunable impedance elements and impedances of non-tunable branches of the network of the network of tunable impedance elements on the frequency of the continuous-wave signal.

34. The method of claim 27, wherein
the input signal is a continuous-wave signal, and
the method further comprises:
receiving an input specifying a magnitude of the continuous-wave signal, and
determining a corresponding one of the set of voltage control signals to be supplied to each tunable impedance element of the network of tunable impedance elements based on a dependency of impedances of the tunable impedance elements and impedances of non-tunable branches of the network of the network of tunable impedance elements on at least one local magnitude of radio frequency voltage or current of the continuous-wave signal.

35. The method of claim 27, wherein
the input signal is a continuous-wave signal, and
the method further comprises:
receiving an input specifying a frequency of the continuous-wave signal,
receiving an input specifying a magnitude of the continuous-wave signal, and
determining a corresponding one of the set of voltage control signals to be supplied to each tunable impedance element of the network of tunable impedance elements based on a dependency of impedances of the tunable impedance elements and impedances of non-tunable branches of the network of the network of tunable impedance elements on the frequency and at least one local magnitude of radio frequency voltage or current of the continuous-wave signal.

36. The method of claim 27, wherein the determining the set of voltage control signals is based on an approximation of the network of tunable impedance elements as a network of lumped ports with characteristic impedances representing impedance values of tunable impedance elements of the network.

37. The method of claim 36, further comprising:
performing the approximation by determining a scattering matrix of the network of lumped ports for a given set of characteristic impedances of lumped ports.

38. The method of claim 37, wherein the determining the scattering matrix is based on an impedance matrix of the network of lumped ports and the characteristic impedances of the lumped ports.

39. The method of claim 27, wherein a ratio of the magnitude of the output signal of the network of tunable impedance elements to a magnitude of the input signal to the network of tunable impedance elements is approximately constant for all possible phase shift input values.

40. A phase shifter, comprising:
a network of tunable impedance elements; and
a controller coupled to the network of tunable impedance elements and configured to:
receive a phase shift input value; and determine a corresponding tuning voltage to be supplied to each tunable impedance element of the network of tunable impedance elements based on the phase shift input value, the network of tunable impedance elements being configured to shift a phase of an input signal based on tuning voltages supplied to the network of tunable impedance elements by the controller;

wherein the input signal is a continuous-wave signal and wherein the controller is further configured to determine the corresponding tuning voltage to be supplied to each tunable impedance element of the network of tunable impedance elements based a dependency of impedances of the tunable impedance elements and impedances of non-tunable branches of the network of tunable impedance elements on one of:

a frequency of the continuous-wave signal;

at least one local magnitude of radio frequency voltage or current of the continuous-wave signal; and a frequency and at least one local magnitude of radio frequency voltage or current of the continuous-wave signal.

41. A phase shifter, comprising:

a network of tunable impedance elements; and a controller coupled to the network of tunable impedance elements and configured to:

receive a phase shift input value; and determine a corresponding tuning voltage to be supplied to each tunable impedance element of the network of tunable impedance elements based on the phase shift input value, the network of tunable impedance elements being configured to shift a phase of an input signal based on tuning voltages supplied to the network of tunable impedance elements by the controller;

wherein the controller is configured to determine the corresponding tuning voltage for each tunable impedance element based on an approximation of the network of tunable impedance elements as a network of lumped ports with characteristic impedances representing impedance values of tunable impedance elements of the network.

42. A phase shifter, comprising:

a network of tunable impedance elements; and a controller coupled to the network of tunable impedance elements and configured to:

receive a phase shift input value; and determine a corresponding tuning voltage to be supplied to each tunable impedance element of the network of tunable impedance elements based on the phase shift input value, the network of tunable impedance elements being configured to shift a phase of an input signal based on tuning voltages supplied to the network of tunable impedance elements by the controller;

wherein the controller is configured to determine the corresponding tuning voltage for each tunable impedance element of the network of tunable impedance elements such that a magnitude of an output signal of the network of tunable impedance elements and a magnitude of an input signal to the network of tunable impedance elements are substantially equal.

43. A phase shifter, comprising:

a network of tunable impedance elements; and a controller coupled to the network of tunable impedance elements and configured to:

receive a phase shift input value; and determine a corresponding tuning voltage to be supplied to each tunable impedance element of the network of tunable impedance elements based on the phase shift input value, the network of tunable impedance elements being configured to shift a phase of an input signal based on tuning voltages supplied to the network of tunable impedance elements by the controller;

wherein the controller is configured to determine the corresponding tuning voltage for each tunable impedance element of the network of tunable impedance elements such that a ratio of a magnitude of an output signal of the network of tunable impedance elements to a magnitude of an input signal to the network of tunable impedance elements is approximately constant for all possible phase shift input values.

* * * * *